United States Patent
Lin

(10) Patent No.: US 10,515,581 B2
(45) Date of Patent: Dec. 24, 2019

(54) LED PIXEL, LED COMPONENT, LED PANEL AND LED DISPLAY SCREEN

(71) Applicant: Shuling Li, Zhanjing, Guangdong (CN)

(72) Inventor: Yi Lin, Guangdong (CN)

(73) Assignee: Shuling Li (CN)

(*) Notice: Subject to any disclaimer, the term of this patent is extended or adjusted under 35 U.S.C. 154(b) by 0 days.

(21) Appl. No.: 15/750,687

(22) PCT Filed: Aug. 6, 2015

(86) PCT No.: PCT/CN2015/086269
§ 371 (c)(1),
(2) Date: Feb. 6, 2018

(87) PCT Pub. No.: WO2017/020300
PCT Pub. Date: Feb. 9, 2017

(65) Prior Publication Data
US 2018/0261149 A1    Sep. 13, 2018

(51) Int. Cl.
*G09G 3/32* (2016.01)
*H01L 33/36* (2010.01)
*H05B 33/08* (2006.01)

(52) U.S. Cl.
CPC ............ *G09G 3/32* (2013.01); *H01L 33/36* (2013.01); *H05B 33/0806* (2013.01); *G09G 2310/0264* (2013.01)

(58) Field of Classification Search
CPC .. G09G 3/32; G09G 2310/0264; H01L 33/00; H01L 33/36; H05B 33/0806
See application file for complete search history.

(56) References Cited

U.S. PATENT DOCUMENTS

| 2004/0208210 | A1* | 10/2004 | Inoguchi | H01L 25/0753 |
| | | | | 372/36 |
| 2006/0158804 | A1* | 7/2006 | Usui | H01L 21/568 |
| | | | | 361/58 |
| 2008/0151143 | A1 | 6/2008 | Li et al. | |

(Continued)

FOREIGN PATENT DOCUMENTS

| CN | 1534355 A | 10/2004 |
| CN | 2817077 Y | 9/2006 |

(Continued)

OTHER PUBLICATIONS

English Translation of CN 203800046.*
English Translation of CN 2817077.*

*Primary Examiner* — Patrick N Edouard
*Assistant Examiner* — Eboni N Giles
(74) *Attorney, Agent, or Firm* — Michael D. Lazzara; Leech Tishman Fuscaldo & Lampl

(57) ABSTRACT

The LED pixel includes a driver IC (20) and an LED chip (40); the LED chip (40) is stacked and mounted on a surface of the driver IC (20), and a wire (31) going from the cathode of the LED chip (40) is connected to the driver IC (20). The driver IC (20) is an unpackaged die. An insulation layer is disposed on the surface of the die, and a pad (30) disposed on the insulation layer is connected to a positive electrode. The LED chip (40) is mounted on the pad (30), and the anode of the LED chip (40) is electrically connected with the pad (40). This improves the light transmittance of the LED display product.

10 Claims, 12 Drawing Sheets

(56) References Cited

U.S. PATENT DOCUMENTS

2010/0003788 A1\* 1/2010 Wang ................. H01L 23/3677
438/118
2015/0371585 A1 12/2015 Bower et al.

FOREIGN PATENT DOCUMENTS

| CN | 101154651 A | 4/2008 |
|---|---|---|
| CN | 103811529 A | 5/2014 |
| CN | 203800046 U | 8/2014 |
| CN | 104979326 A | 10/2015 |
| CN | 204857715 U | 12/2015 |
| CN | 205016161 U | 2/2016 |
| JP | H06314863 A | 11/1994 |

\* cited by examiner

LED PIXEL, LED COMPONENT, LED PANEL AND LED DISPLAY SCREEN

CLAIM OF PRIORITY

This application is a U.S. national stage filing under 35 U.S.C. § 371 of International Application No. PCT/CN2015/086269 filed Aug. 6, 2015, which is incorporated herein by reference in its entirety.

TECHNICAL FIELD

The present disclosure relates to the field of LED display, and in particular relates to an LED pixel, an LED component, an LED panel and an LED display screen.

BACKGROUND

Since the transparent light-emitting diode (LED) display screen is transparent with no obstacles in the line of sight and provides an outstanding display effect, it becomes more and more favored in the market and it is more and more widely applied in high-end places such as malls, airports, banks and luxury stores. However, due to the extreme complexity of a control circuit in the LED display screen, in order to achieve a good transparency, it needs not only to ensure that a basic logic circuit drives all the LED lights to work normally, but also to minimize the obstruction to line of sight caused by the hardware. The hardware includes a mechanical component, a printed circuit board (PCB), a plastic assembly and electronic components such as a driver integrated circuit (IC), LED lights. Thus, the higher the pixel density of the LED display screen is, the more difficult its transparency can be achieved. For example, the common package size of an LED light includes SMD3535 (outline dimension: 3.5 mm×3.5 mm), SMD3528 (outline dimension: 3.5 mm×2.8 mm) and SMD2121 (outline dimension: 2.1 mm×2.1 mm). Since the minimum package size of the driver IC of the LED display screen is 4 mm×4 mm, because of the non-transparent components and the complex interconnections among the logic circuits, it is essentially impossible to achieve a transparent LED display screen with a pixel pitch under 5 mm.

At present, a transparent LED display technology, which uses a transparent conducting film as the conducting and signal pattern layer to drive the LED chip, is available on the market. However, since the impedance of the transparent conducting film is much larger than that of copper foil for the conventional PCB, the width of the transparent conducting line needs to be made large so as to connect the driver IC with the LED chip using a circuit graph layer formed on the transparent conducting film. Therefore, it hard to manufacture a transparent LED display screen with a high pixel density.

SUMMARY

The present disclosure provides an LED pixel, an LED component, an LED panel and an LED display screen. Since the LED chips are stacked and mounted on the surface of the driver IC, and an opaque driver IC and a group of opaque LED chips are disposed in the same pixel, so as to decrease the shadowed area and improve the light transmittance of the LED display product.

In order to achieve above design, the present disclosure is implemented as follows:

In a first aspect, the present disclosure provides an LED pixel, which includes a driver IC and an LED chip; wherein the LED chip is stacked and mounted on a surface of the driver IC, and a wire going from a cathode of the LED chip is connected to the driver IC.

In an embodiment, the driver IC is an unpackaged die; and an insulation layer is arranged on a surface of the die, and a pad arranged on the insulation layer is connected to a positive electrode, the LED chip is arranged on the pad, and an anode of the LED chip is electrically connected to the pad.

In an embodiment, a number of the LED chip is three; and the wire is a gold wire arranged by bonding.

In a second aspect, the present disclosure provides an LED component, which includes: a composite layer, a plurality of driver ICs and a plurality of LED chips which are evenly arranged in length and breadth at the front side of the composite layer;

the LED chips include a plurality of first LED chips, each of driver ICs corresponds to a group of the first LED chips, the driver ICs are arranged at the front side of the composite layer, and the first LED chips are stacked and mounted on surfaces of the driver ICs; a plurality of wires going from the cathodes of the respective LED chips are connected to the driver ICs; each of the driver ICs is connected with each other via a signal line.

In an embodiment, the LED chips further include a plurality of second LED chips; the second LED chips are mounted at the front side of the composite layer; a plurality of blind holes are opened at the front side of the composite layer, anodes of the second LED chips are connected to a positive electrode in the composite layer through the blind hole; a wire going from a VDD pin of each driver IC is connected to the positive electrode in the composite layer through one of the blind holes; a wire going from a GND pin of each driver IC is connected to a negative electrode in the composite layer through one of the blind holes.

In an embodiment, the composite layer is a transparent composite layer, and the driver ICs are unpackaged dies, the wires and the signal lines are gold wires arranged by bonding.

In an embodiment, the ratio of the number of the first LED chips to the number of the LED chips is 1:x, wherein x∈{2, 3, 4, 5, 6, 9}.

In an embodiment, the composite layer further includes a substrate, an electrode layer and a second insulation layer which are successively arranged;

the electrode layer is provided with a positive electrode and a negative electrode, a plurality of blind holes are opened in the substrate, the blind holes go through the substrate and reach the positive electrode and the negative electrode.

In an embodiment, the composite layer further includes a substrate, a first electrode layer, an first insulation layer, a second electrode layer and a second insulation layer, which are successively arranged; one of the first electrode layer and the second electrode layer is configured as the positive electrode and the other one is configured as the negative electrode; the blind holes comprise a first blind hole penetrating the substrate and reaching the positive electrode, and a second hole penetrating the substrate and reaching the negative electrode; the wire going from the anode of the each LED chip is connected to the positive electrode through the first blind hole; the wire going from the VDD pin of the driver IC is connected to the positive electrode through the first blind hole; the wire going from the GND pin of the each driver IC is connected to the negative electrode through the second blind hole.

In an embodiment, the composite layer further includes a third insulation layer and a signal line layer, the signal line layer is insulated from the first electrode layer or the second electrode layer; the blind holes further comprise a third blind hole penetrating the substrate and reaching the signal line layer; the signal line is a signal pattern layer disposed in the signal line layer, and a wire going from a signal pin of the each driver IC is connected to the signal pattern layer through the third blind hole.

In an embodiment, the composite layer includes at least two signal line layers and at least two third insulation layers.

In an embodiment, a plurality of pads are arranged at the bottom of the blind holes, and the wires are electrically connected to the composite layer through the pads.

In an embodiment, the LED chips and the driver ICs are mounted on the substrate by using chip-on-board (COB) process or chip-on-glass (COG) process, and the front side of the substrate is covered with the transparent sealing glue.

In a third aspect, the present disclosure provides an LED panel, wherein the LED panel includes at least two LED components as described above.

In a fourth aspect, the present disclosure provides an LED display screen, wherein the LED display screen includes the LED panel as described above.

The beneficial effects of the present disclosure are as follow: the LED chips are stacked and mounted on the surface of the driver IC, and the opaque driver IC and a group of the opaque LED chips are disposed in the same pixel, which enables the direct driving to the LED chips, reducing the complexity of connections of the circuit, decreasing the shadowed area, and improving the light transmittance of the LED display product. Meanwhile, since the driver IC is a die of an extremely small size and connected with the second LED chips which evenly distributed around the driver IC by direct bonding in a shortest distance, avoiding the complexity of circuit connections between the driver IC and the LED chip in a conventional LED display screen. Therefore, the use of the transparent conducting material with a large resistance as the main signal conducting material may be avoided, thereby extremely simplifying the circuit design of transparent conducting graph layer.

BRIEF DESCRIPTION OF DRAWINGS

In order to make a clear description for the present disclosure, a simple description about the drawings to be used in the present disclosure is given as follows. Apparently, the drawings hereafter merely illustrate some embodiments of the present disclosure. For a person having ordinary skill in the art, other drawings may be achieved based on the contents of embodiments and drawings of the present disclosure without creative works.

10—composite layer; 11—substrate; 121—positive electrode; 122—negative electrode; 13—first insulation layer; 14—third insulation layer; 15—second insulation layer; 16—signal line layer; 20—driver IC; 30—pad; 31—wire; 40—LED chip; 41—first LED chip; 42—second LED chip.

DETAILED DESCRIPTION

In order to make the technical problems, the technical solutions and the technical effects more clear, a description for the technical solutions in the present disclosure is given in combination with drawings. Based on embodiments of the present disclosure, other embodiments of the present disclosure may be achieved by those skilled in the art without creative works, and these embodiments fall into the scope of the protection of the present disclosure.

The First Embodiment

Figure 1:
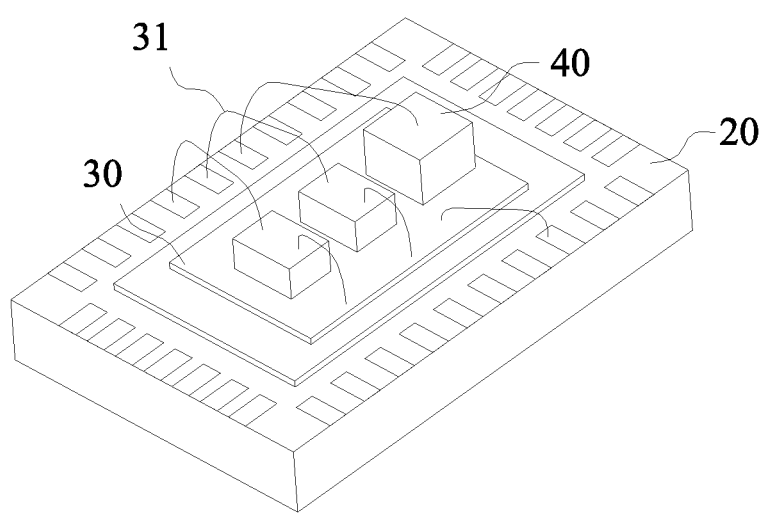
FIG. 1 is a structural diagram showing a light-emitting diode (LED) pixel according to an embodiment of the present disclosure.
Figure 2:
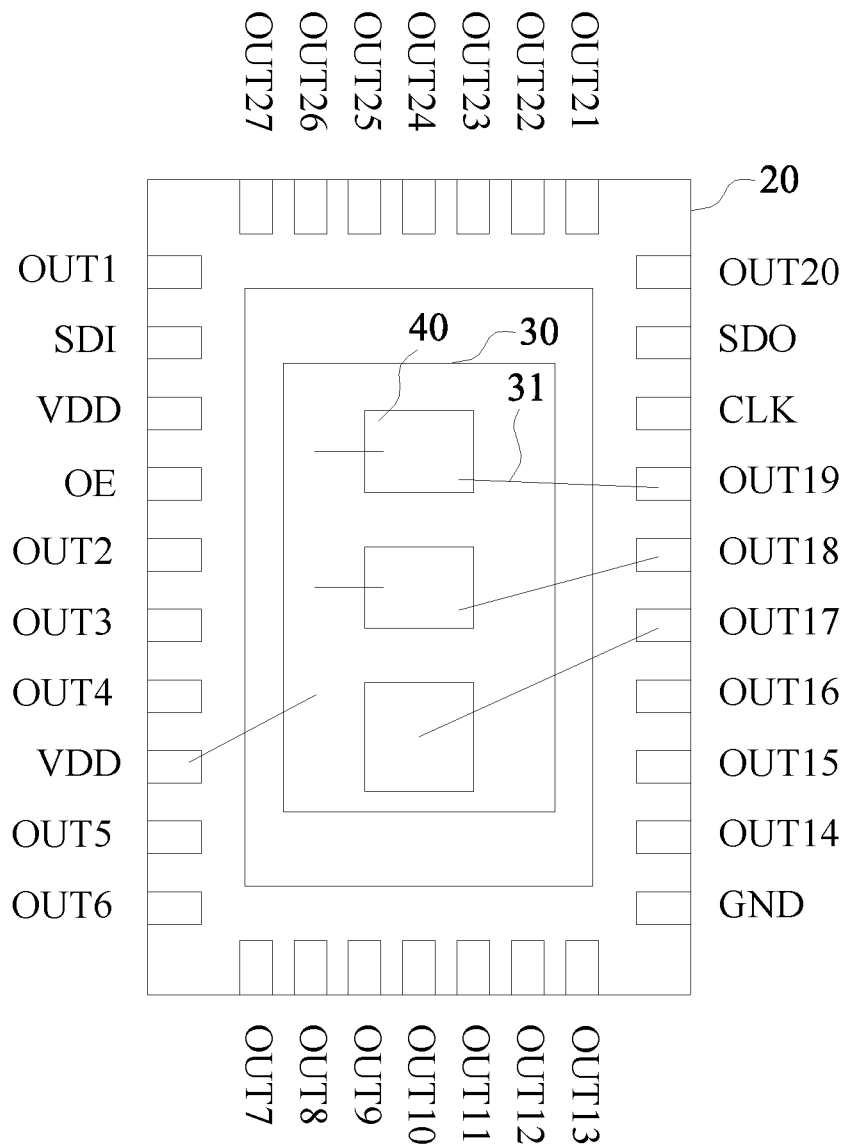
FIG. 2 is a top view showing the LED pixel according to an embodiment of the present disclosure.

FIG. 1 is a structural diagram showing a light-emitting diode (LED) pixel according to an embodiment of the present disclosure and FIG. 2 is a top view showing the LED pixel according to an embodiment of the present disclosure. As shown in FIG. 1 and FIG. 2, the LED pixel includes a driver IC 20 and a LED chip 40; the LED chip 40 is stacked and mounted on the surface of the driver IC 20, and a wire 31 going from the cathode of the LED chip 40 is connected to the driver IC 20.

Further, the driver IC 20 is an unpackaged die; an insulation layer is disposed on the surface of the die, and a pad 30 arranged on the insulation layer is connected to the positive electrode 121, the LED chip 40 is arranged on the pad, the anode of the LED chip 40 is electrically connected to the pad 30.

Further, the number of the LED chips 40 is three; and the wire is a gold wire arranged by bonding.

In conventional LED display technology, one or more LED lights are arranged in each of the pixels to implement the display of a preset image. The large size of the LED lights results in the large pixels of the LED display screen in prior art, and the display effect is not exquisite. Furthermore, a high transmittance cannot be achieved due to the obstruction of the LED lights. Each pixel is implemented based on a tiny LED chip 40 rather than packaged LED lights. In the conventional technology, the LED chip 40 may be manufactured in a size of 0.15 mm×0.15 mm or even smaller, which enables a dense arrangement of the LED chips 40 and a pixel space under 4 mm, and manufacturing of a transparent LED display screen of high density. Meanwhile, when an unpackaged die is used as the driver IC 20, since the size of the driver IC 20 is commonly under 2 mm×2 mm, and almost imperceptible to human eyes from a distance. Therefore, the gap between each of the pixels is big enough, so that the light transmittance may be improved. As shown in FIG. 1, each pixel is provided with three LED chips 40, i.e., a red-color LED (R-LED) chip 40, a green-color LED (G-LED) chip 40 and a blue-color LED (B-LED) chip 40. When each pixel is provided with LED chips 40 in three colors, a full-color display is achieved. For another simple implementation, each of the driver ICs 20 is provided with an LED chip to perform the simplest LED display. The colors of the LED chips 40 are red, green, blue or white. The monochromatic LED display screen may be configured to display simple contents of a notice board, etc.

The Second Embodiment

Figure 3:
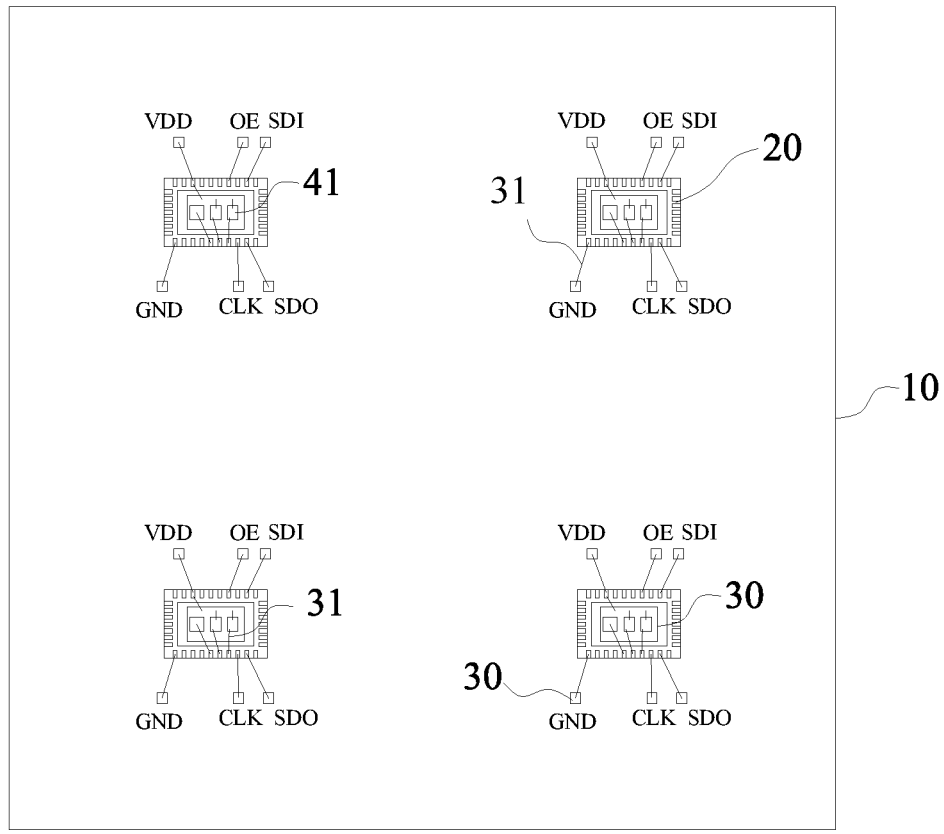
FIG. 3 is a main view showing a first embodiment of a LED component according to the embodiments of the present disclosure.

FIG. 3 is a main view showing the first embodiment of a LED component according to the embodiments of the present disclosure. As shown in FIG. 3, the LED component includes a composite layer 10, multiple driver ICs 20 and multiple LED chips 40 which are evenly arranged in length and breadth at the front side of the composite layer 10; the LED chips 40 include multiple first LED chips 41, and each of the driver ICs 20 corresponds to a group of the first LED chips 41, and the drivers IC are mounted at the front side of the composite layer 10, and the first LED chips are stacked and mounted on surfaces of the driver ICs 20; wires going from the cathodes of the respective LED chips 40 are connected to the driver ICs 20; each of the driver ICs 20 is connected with each other via a signal line. The front side refers to a side lied on the direction of light propagation when the light is emitted, and the direction of light propagation is taken as the reference of rear and front.

In this embodiment, each of the pixels includes the first LED chip 20 and the driver IC 20, and a group of the first LED chips 41 are stacked and mounted on the surface of the driver IC 20. In other words, all the LED chips 40 are the first LED chips 41 and need to be driven by the respective exclusive driver ICs 20.

In this embodiment, the LED chips 40 are arranged in an array, and the spacing between two adjacent rows is equal to the spacing between two adjacent columns.

The composite layer 10 is a transparent composite layer. The composite layer 10 includes a lamination formed by multi-layers of the transparent conducting/insulating material materials. The transparent insulating material is for example glass, polyethylene terephthalate (PET), polyvinyl chloride (PVC), polycarbonate (PC), polyethylene (PE), acrylic; the transparent conducting material is for example acrylic conducting transparent glue, indium tin oxide (ITO) and indium zinc oxide (IZO). The transparent conductive material is attached on the insulating material by using methods such as deposition, sputtering, which is familiar to those skilled in the art.

By providing a transparent composite layer in which a transparent conducting film and a transparent insulator are arranged, and the LED chips 40 and the driver ICs 20 are stacked and mounted at the front side of the transparent composite layer, the power supply and the signal of the LED chips 40 and the driver ICs 20 are transmitted via a transparent conductor in the internal of the transparent composite layer. Since the transparent insulator achieves the insulation between the transparent conductors in each layer, a full transparency is achieved in the area of the transparent composite layer except the driver ICs 20, further providing a LED display screen, the pixel spacing of which is in a range of 2 mm to 4 mm and the transparency is over 90%.

The description of the embodiments of LED component is mainly performed based on the implementation of the transparent composite layer. The driver ICs 20 are unpackaged dies, the wires 31 and the signal lines are gold wires arranged by bonding.

Since the unpackaged die has a smaller structure than the packaged chip, a better transparency is achieved. The bonding process is widely used in conventional technologies, and no further descriptions are made here.

Figure 15:
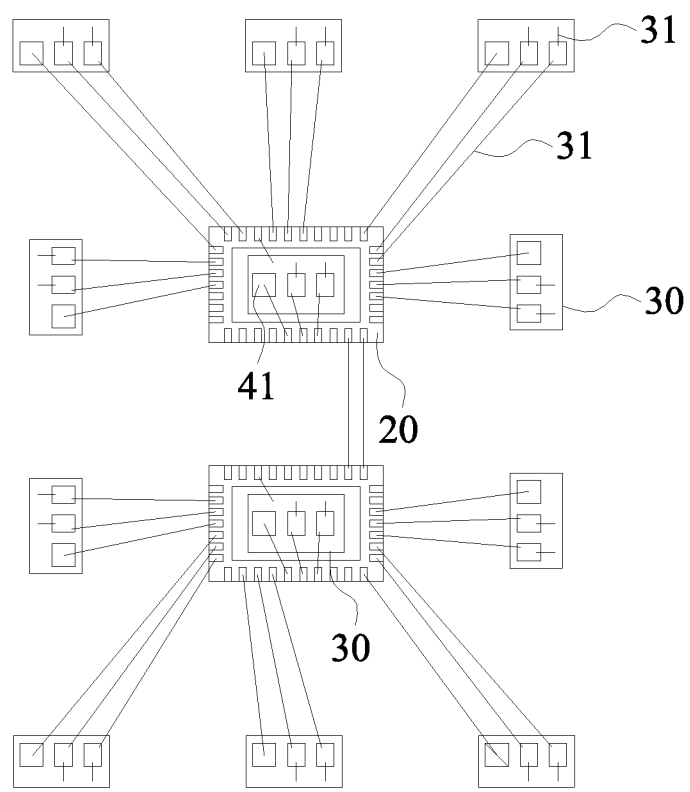
FIG. 15 is a main view showing another arrangement of the LED chips in the third embodiment of the LED component according to the embodiments of the present disclosure.

In this embodiment, the conducting film disposed in the composite layer 10 is responsible for the power supply of the LED chips 40 and the driver ICs 20; as shown in FIG. 3, the driver ICs 20 are arranged one by one, and the signal transmission between the driver ICs 20 is achieved via the signal line at the front side of the composite layer 10. As shown in FIG. 15, the bonded gold wire between two driver ICs serves as the signal line for communication.

The LED chips 40 and the driver ICs 20 are mounted on the substrate 11 by using the chip-on-board (COB) process or the chip-on-glass (COG) process.

The front side of the substrate 11 is covered with the transparent sealing glue. In general, the transparent sealing glue is made of one material of the group consisting of polyurethane, epoxy resin, polyethylene vinyl acetate (PEVA).

The COB process, the COG process and sealing process are widely used in conventional technologies, and no further descriptions are made here.

The Third Embodiment

Figure 4:
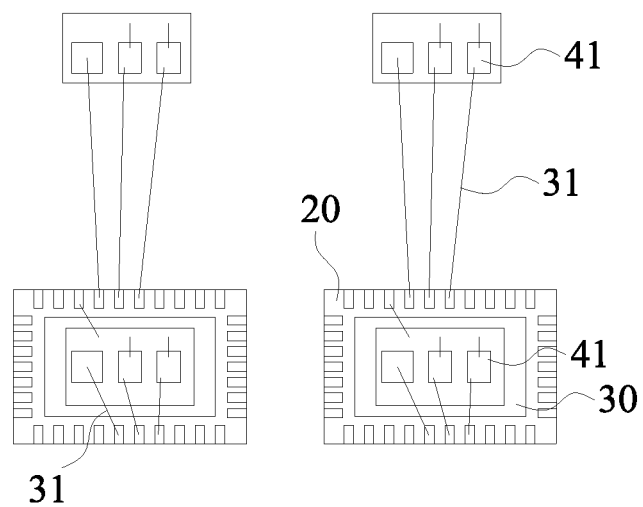
FIG. 4 is a main view showing an arrangement of the LED chips in the second embodiment of the LED component according to the embodiments of the present disclosure.

Referring to FIG. 4, FIG. 4 is a main view showing an arrangement of the LED chips in the second embodiment of the LED component according to the embodiments of the present disclosure. As shown in FIG. 4, the LED chips 40 further include multiple second LED chips 42; the second LED chips 42 are mounted at the front side of the composite layer 10; blind holes are opened at the front side of the composite layer 10, and pads 30 are arranged at the bottom of the blind holes, and a wire 31 going from the anode of each second LED chip 42 is connected to a pad 30 so as to connect with positive electrode 121 in the internal of the composite layer 10; a wire 31 going from the VDD pin of each driver IC 20 is connected to a positive electrode 121 in the composite layer through one of the blind holes; a wire 31 going from the GND pin of the each driver IC 20 is connected to a negative electrode 122 in the composite layer 10 through one of the blind holes.

Figure 5:
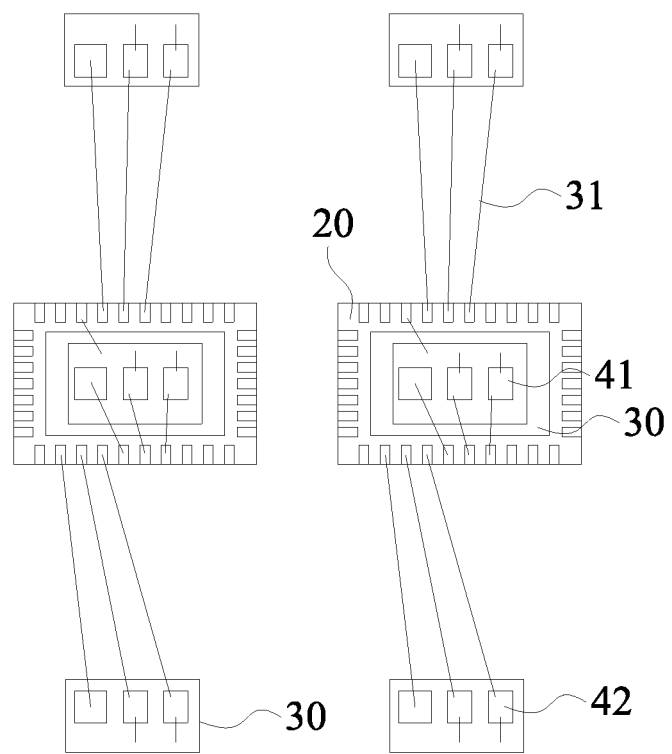
FIG. 5 is a main view showing another arrangement of the LED chips in the second embodiment of the LED component according to the according to the embodiments of the present disclosure.

As shown in FIG. 4, each of the driver ICs 20 is configured to drive a group of the first LED chips 41 and a group of the second LED chips 42 adjacent to the group of the first LED chips 41. In other words, a working unit includes two pixels and a driver IC 20, and one of the pixels is stacked on the driver IC 20. This arrangement takes full use of the pins and signal processing ability of the driver IC 20, and reduces the waste of the performance of the driver IC 20. Further, FIG. 5 is a main view showing another arrangement of the LED chips in the second embodiment of the LED component according to the according to the embodiments of the present disclosure. As shown in FIG. 5, each of the driver ICs 20 is configured to drive a group of the first LED chips 41 and two groups of the second LED chips 42. The group of the first LED chips 41 is arranged between the two groups of the second LED chips 42, and the second LED chips 42 and driver IC 20 are connected via the bonded gold wires. The two arrangements described here, as well as the arrangement in the former embodiment, are relatively simple, since the driver ICs 20 may be configured one by one, and the signal lines between the driver ICs 20 may be bonded gold wires.

Figure 6:
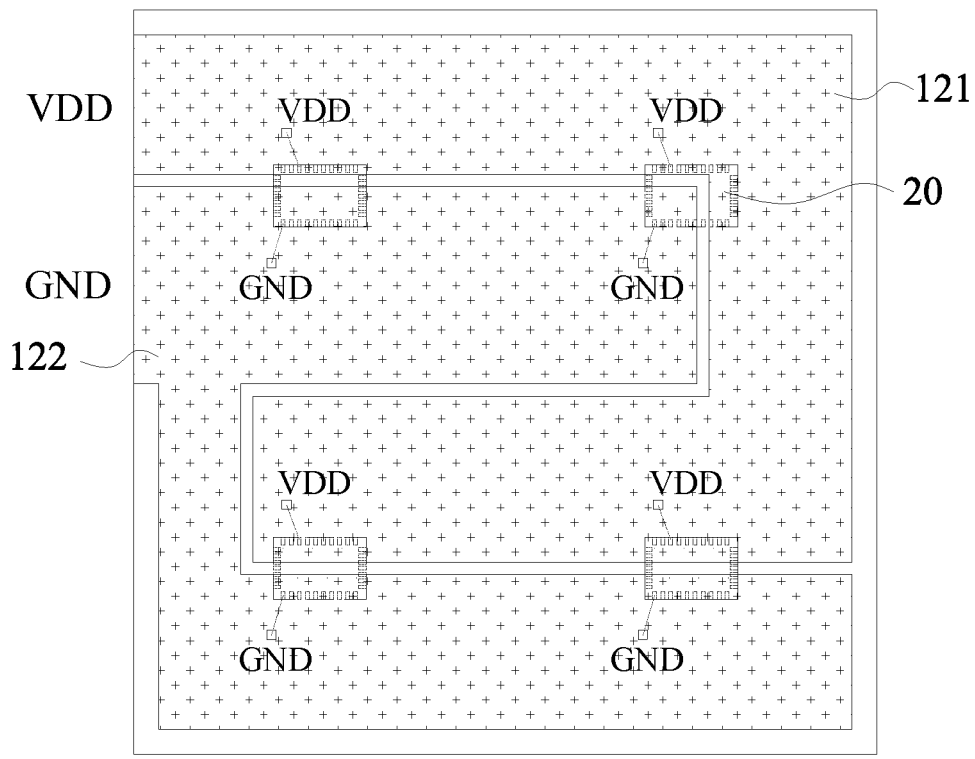
FIG. 6 is a diagram showing the connections in an electrode layer in the second embodiment of the LED component according to the embodiments of the present disclosure.

For the distribution of electrode in the internal of the transparent composite layer, referring to FIG. 6, the composite layer 10 includes a substrate 11, an electrode layer and a second insulation layer 15, which are successively arranged; the electrode layer is provided with a positive electrode 121 and a negative electrode 122. Multiple blind holes are opened in the composite layer 10, which penetrate the substrate 11 and reach the positive electrode 121 or the negative electrode 122.

The shadowed part shown in FIG. 6 is the distribution area of the electrode layer. In order to enable the driver ICs 20 and the LED chips 40 to work, the positive electrode layer 121 and the negative electrode layer 122 are required for the power supply. Two independent electrodes (the positive electrode layer 121 and the negative electrode layer 122) are disposed on the insulation layer, and the positive electrode layer 121 and the negative electrode layer 122 may be seemed to be juxtaposed in the same layer, but the positive electrode layer 121 and the negative electrode layer 122 are isolated and working independently. The thickness of the electrode layer made by the transparent conductor is extremely small, and in order to reduce the resistance during power supply, the width of the electrode layer is commonly configured to be relative large.

The blind holes opened at the substrate 11 reach the positive electrode 121 and the negative electrode 122. The VDD pins and the GND pins of the driver ICs 20 are respectively connected to the positive electrode 121 and the negative electrode 122 via the blind holes; certainly, the anodes of the second LED chips 42 are connected to the positive electrode 121 via the blind holes. It is more convenient for the anodes of the first LED chips 41 to connect to the positive electrode 121 through the VDD pins of the driver ICs 20.

For connection relationship among the driver ICs 20, the LED chips 42 and the internal of the composite layer, in order to ensure connection effect, pads 30 may arranged at the bottom of all the blind holes, i.e., the driver ICs 20 and the LED chips 42 are connected to the corresponding conducting layer through the pads 30. The wire 31 and the signal line are all gold wires arranged by bonding. The gold wires have a tiny diameter and are almost imperceptible to human eyes. The connections between the LED chips 42 and the driver ICs 20, the connections between the LED chips 30 and the internal of the composite layer 10 and the connections between the drives ICs 20 and the internal of the composite layer 10 are achieved via the gold wires.

Further, the positive electrode 121 and the negative electrode 122 may be arranged in two parallel layers, which are insulated by an insulation layer. The composite layer 10 includes a substrate 11, a first electrode layer, a first insulation layer 13, a second electrode layer and a second insulation layer 15, which are successively arranged; one the first electrode layer and the second electrode layer is configured as a positive electrode 121 and the other is configured as a negative 122 electrode; the blind holes include a first blind hole penetrating the substrate 11 and reaching the positive electrode 121, a second blind hole penetrating the substrate 11 and reaching the positive electrode 122; the wire 31 going from the anode of the each LED chip 30 is connected to the positive electrode 121 via the first blind hole; the wire 31 going from the VDD pin of the each driver IC 20 is connected to the positive electrode 121 via the first blind hole; the wire going from the GND pin of the each driver IC 20 is connected to the negative electrode 122 via the second blind hole. The first LED chips 41 are arranged on the driver ICs 20 and are powered through the driver ICs; the second LED chips 42 are arranged at the front side of the composite layer 10. Pads 30 are disposed on the composite layer 10, and then the pads 30 are connected to the electrode layer via the wires 31; on the pads 30, the manner in which the LED chips 40 are connected may be selected according to the structural characteristics of the LED chips 40. For example, an anode of an R-LED chip may be connected into the circuit once being welded to the pad; and a G-LED chip may be connected into the circuit through a wire 30 which connects the anode of the G-LED to the pad 30 beneath the G-LED. The wire 31 going from the VDD pin of the each driver IC 20 is connected to the positive electrode 121 via the first blind hole, and the wire 31 going from the GND pin of the each driver IC 20 is connected to the negative electrode 122 via the second blind hole. The relative positions of the positive electrode 121 and the negative electrode 122 are not strictly limited and merely needs to provide power supply to each electronic component.

It should be noted that, the LED chip 40 may be mounted on the pad 30 using flip chip technology, in such a way that the process of gold wires bonding may partially reduce. Since the flip chip technology is known to those skilled in the art, and no repetitions are made here.

The Fourth Embodiment

Figure 7:
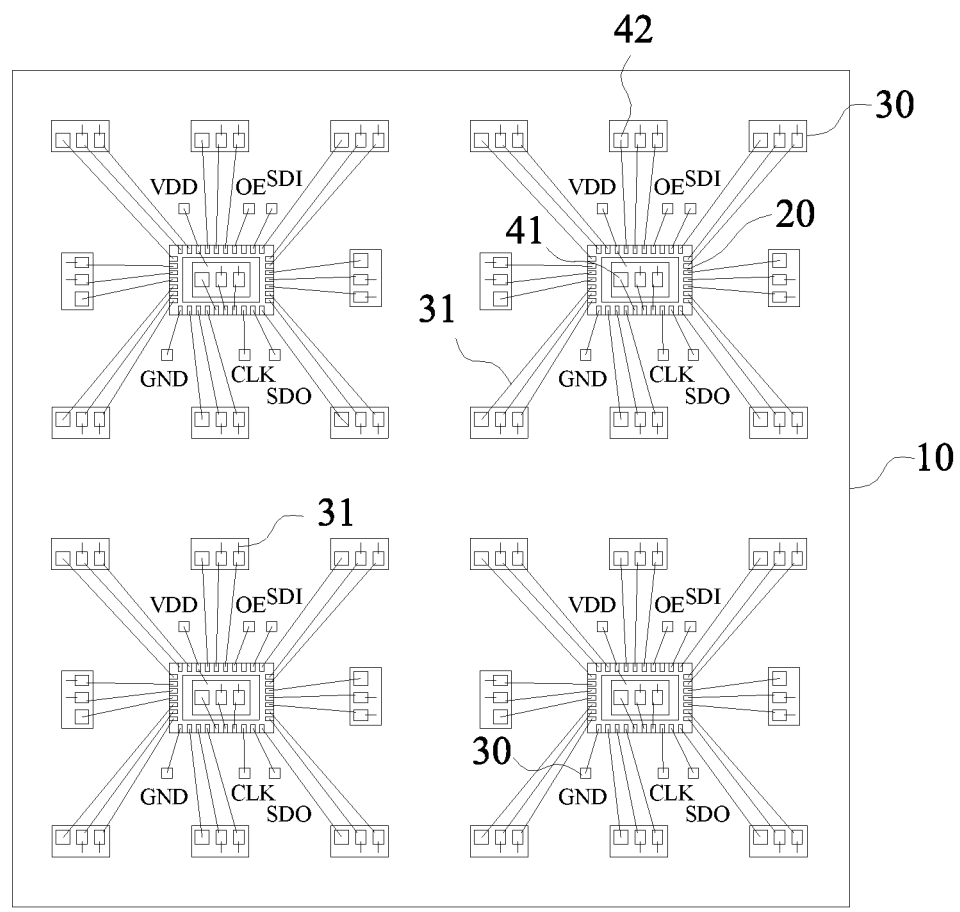
FIG. 7 is a main view showing an arrangement of the LED chips in the third embodiment of the LED component according to the embodiments of the present disclosure.
Figure 8:
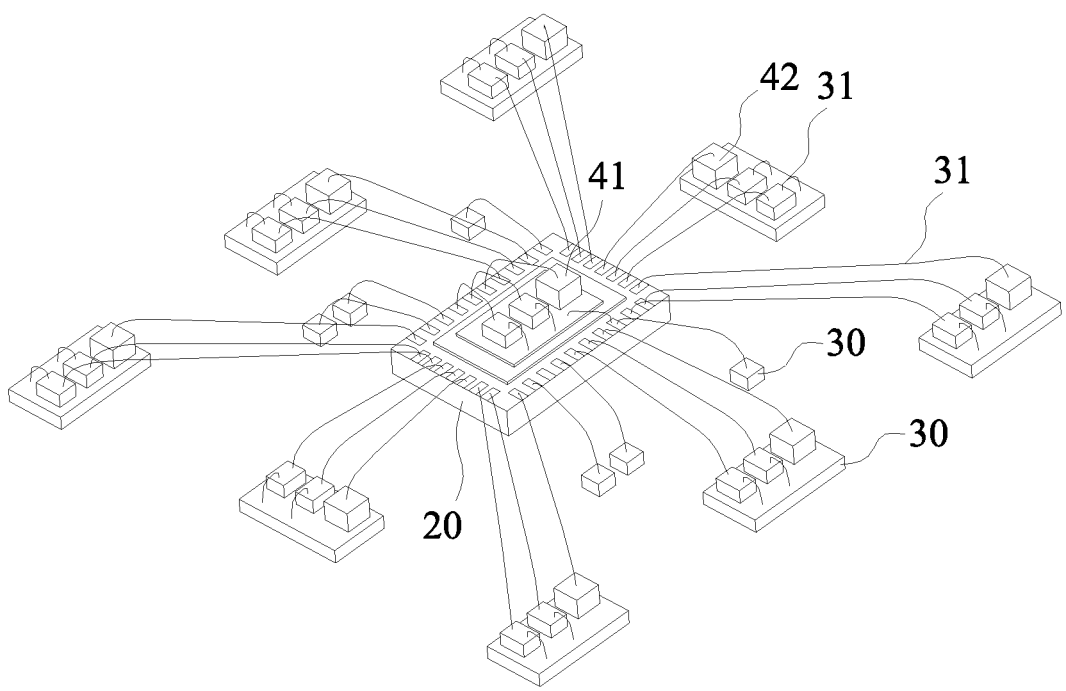
FIG. 8 is a 3-dimensional view showing the line connections of the third embodiment in the LED component according to the embodiments of the present disclosure.
Figure 9:
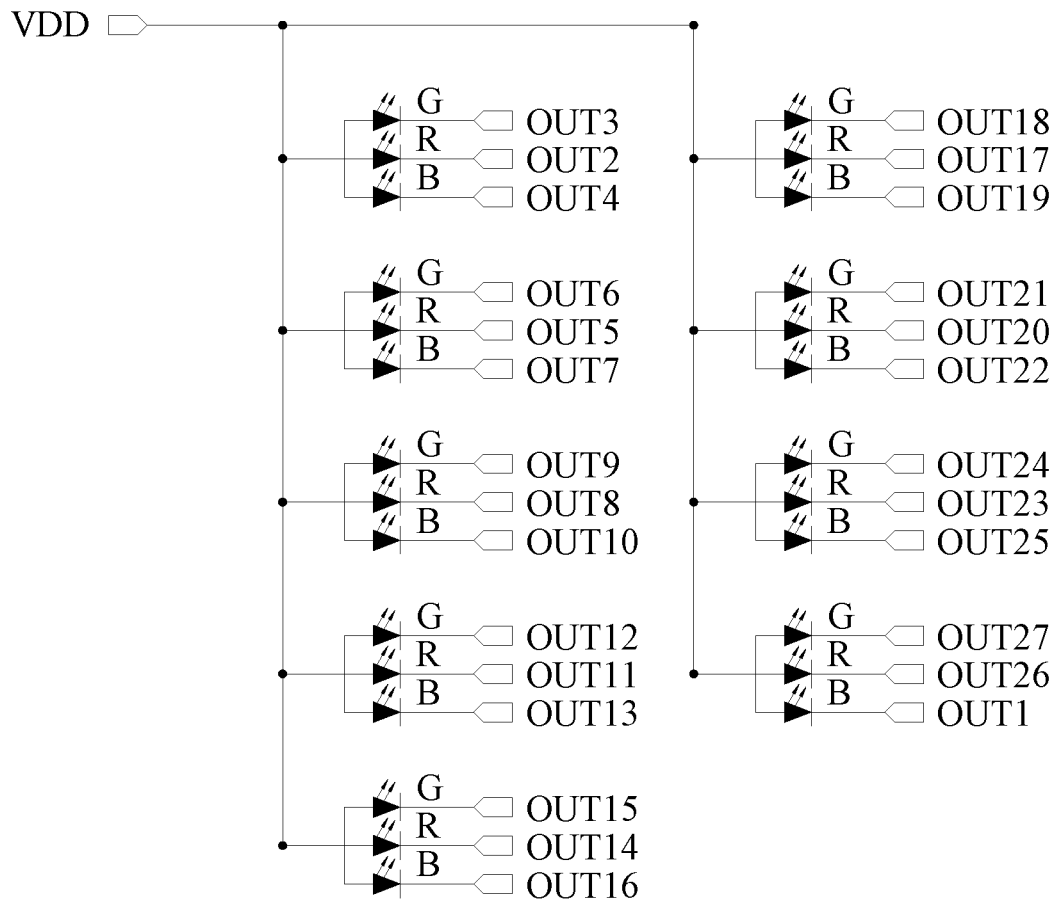
FIG. 9 is a diagram showing the logic connections between the driver IC and the LED chips in the third embodiment of the LED component according to the embodiments of the present disclosure.
Figure 10:
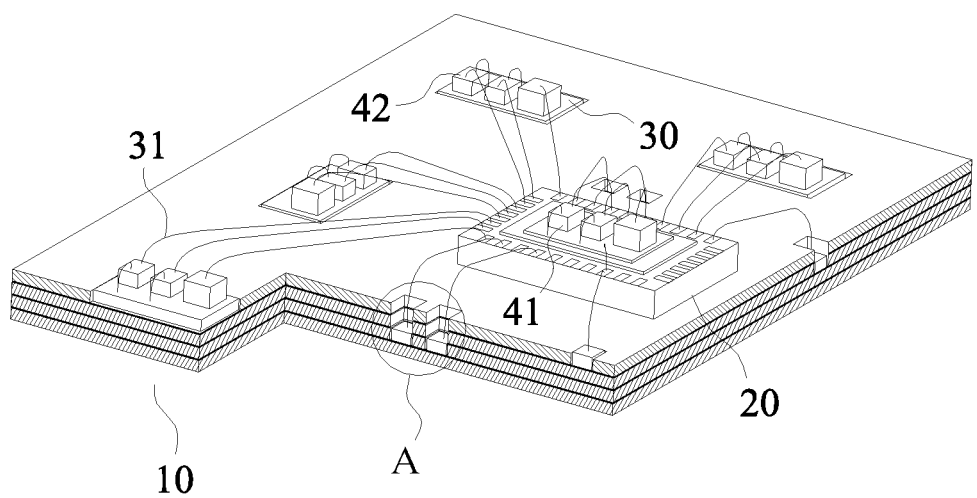
FIG. 10 is an internal structure diagram of the third embodiment of the LED component according to the embodiments of the present disclosure.
Figure 11:
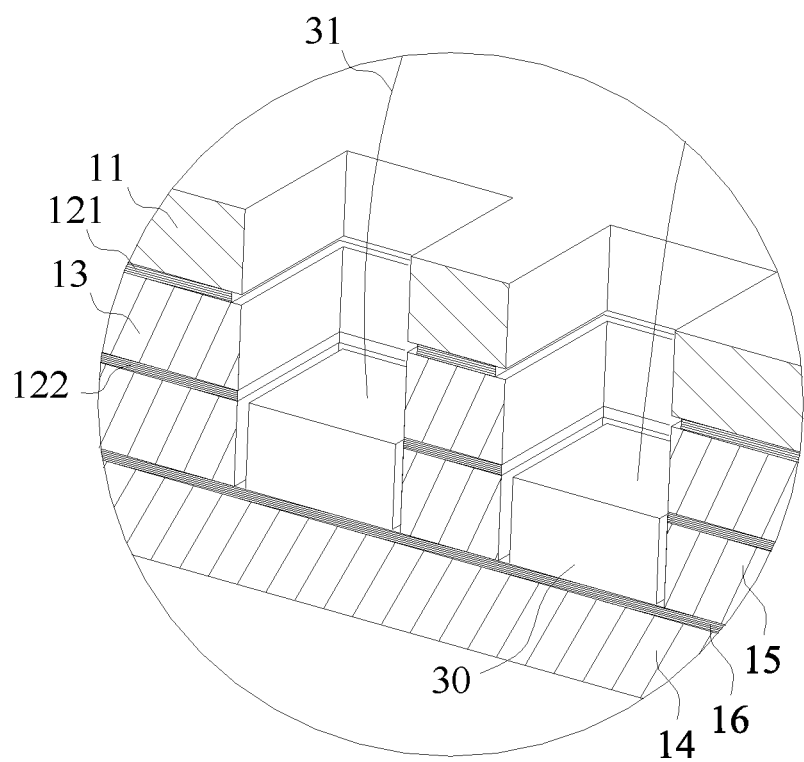
FIG. 11 is a partial enlarged diagram in position A of FIG. 10.
Figure 12:
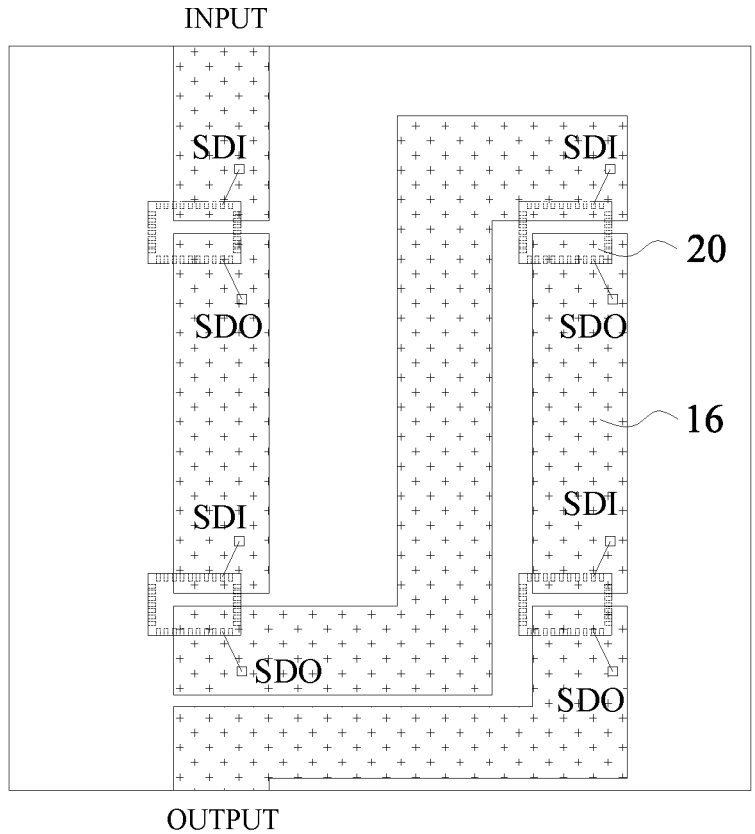
FIG. 12 is a diagram showing the connections of the signal line layer in the third embodiment of the LED component according to the embodiments of the present disclosure.

Reference is made to FIG. 7 to FIG. 12. FIG. 7 is a main view showing an arrangement of the LED chips in the third embodiment of the LED component according to the embodiments of the present disclosure; FIG. 8 is a 3-dimensional view showing the line connections of the third embodiment in the LED component according to the embodiments of the present disclosure; FIG. 9 is a diagram showing the logic connections between the driver IC and the LED chips in the third embodiment of the LED component according to the embodiments of the present disclosure;

FIG. 10 is an internal structure diagram of the third embodiment of the LED component according to the embodiments of the present disclosure; FIG. 11 is a partial enlarged diagram in the position A of FIG. 10; and FIG. 12 is a diagram showing the connections of the signal line layer in the third embodiment of the LED component according to the embodiments of the present disclosure. As shown in FIG. 7 and FIG. 8, the ratio between the number of the first LED chips 41 to the number of the LED chips 40 is 1:9. That is, each of the driver ICs 20 is configured to drive a group of the first LED chips 41 and eight groups of the second LED chips 42. At this moment, the driving relationship between the driver ICs 20 and the LED chips 40 is shown in FIG. 9. While the problem of this distribution is that the driver ICs 20 cannot be adjacently arranged, and if the signal lines are made by the gold wires, not only a large span occurs, but also the phenomenon of short-circuiting between different wires is observed. Therefore, the transmission of signals is achieved by employing the internal structure shown in FIG. 10, as shown in FIG. 10 and FIG. 11.

The composite layer 10 includes a substrate 11, a first electrode layer, a first insulation layer 13, a second electrode layer and a second insulation layer 15, which are successively arranged; one of the first electrode layer and the second electrode layer is configured as a positive electrode 121 and the other one is configured as a negative electrode 122; the blind holes include a first blind hole penetrating the substrate 11 and reaching the positive electrode 121, and a second blind hole penetrating the substrate 11 and reaching the positive electrode 122; the wire 31 going from the anode of each LED chip 40 is connected to the positive electrode 121 via the first blind hole; the wire 31 going from the VDD pin of each driver IC 20 is connected to the positive electrode 121 via the first blind hole; the wire going from the GND pin of each driver IC 20 is connected to the negative electrode 122 via the second blind hole.

The composite layer 10 further includes a third insulation layer 14 and a signal line layer 16 insulated from the first electrode layer or the second electrode layer; the blind holes further comprise a third blind hole penetrating the substrate 11 and reaching the signal line layer 16; the signal line is a signal pattern layer disposed in the signal line layer 16, and the wire going from the signal pin of each driver IC is connected to the signal pattern layer via the third blind hole.

As shown in FIG. 12, since the communications between the driver ICs 20 merely needs a small number of signals, signal patterns with a relative large width and mutual-isolated are disposed in the transparent conducting film, in such a way that the potential decreasing caused by the large resistance of the transparent conductive film is avoided and signal distortion is avoided. In this embodiment, each driver IC 20 has a signal input pin SDI and a signal output pin SDO. The driver ICs 20 are connected in sequence. The output of the light-emitting module, on which the driver ICs 20 are arranged as shown in FIG. 12, corresponds to the input of a next light-emitting module, thereby delivering the signal to the next light-emitting module. According to the functions of the driver IC 20, if there are a lot of communication signals between the driver ICs 20, e.g., in a case of the CLK input and the OE input, a single signal line layer 16 may be unable to satisfy the requirement for communication signals. Therefore, at least two signal line layers 16 and at least two third insulation layers 14 may be disposed. Each of signal lines may form a signal line layer 16, which is insulated from other conducting layers via a third insulation layer 14. In practical arrangement, the positive electrode 121, the negative electrode 122 and two signal line layers 16 do not have the order for before and after in absolute sense and only needs to be insulated from each other by the insulation layers, and the positive electrode 121, the negative electrode 122 and two signal line layers 16 may be connected to corresponding components through the blind holes. The signal line layer 16 is not obliged to be disposed at the last layer, that is, the positive electrode 121, the negative electrode 122 and two signal line layers 16 may be randomly arranged and only needs to be insulated from each other by the insulation layers.

Certainly, the arrangement of the LED chips of above embodiments and other arrangements of the LED chips which are not described in detail may achieve the signal transmission through a built-in signal line layer 16.

Figure 13:
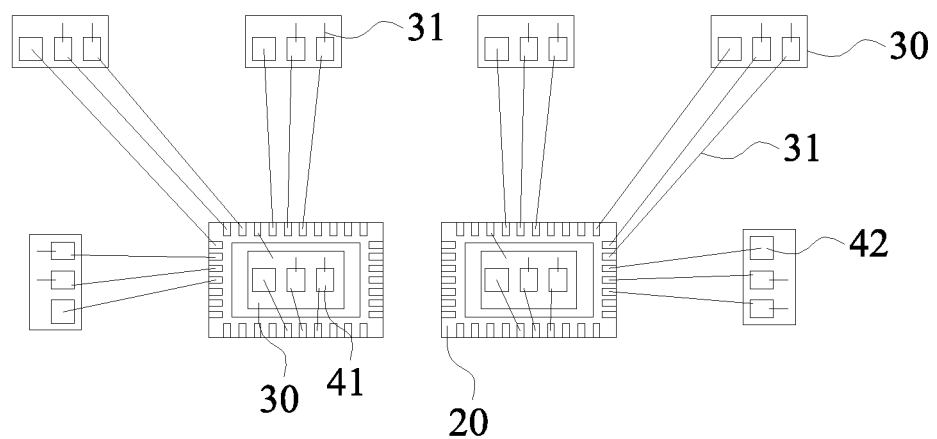
FIG. 13 is a main view showing another arrangement of the LED chips in the third embodiment of the LED component according to the embodiments of the present disclosure.
Figure 14:
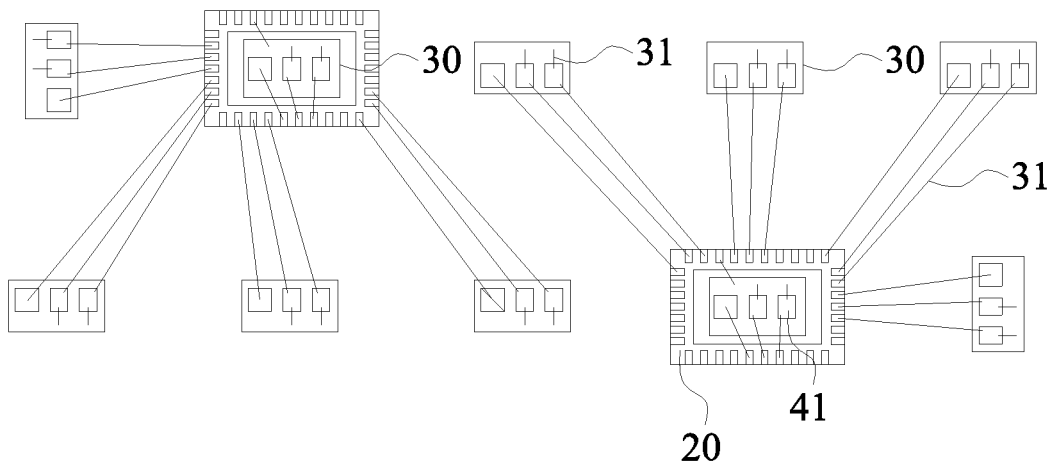
FIG. 14 is a main view showing another arrangement of the LED chips in the third embodiment of the LED component according to the embodiments of the present disclosure.

Further, as shown in FIG. 13, FIG. 14 and FIG. 15, a driver IC 20 may correspond to four, five or six groups of the LED chips 40. Actually, the configuration that a driver IC 20 corresponds to seven or eight groups of the LED chips 40 is also achievable and is a little more complex than the preferred implementation. The gold wires connecting the driver IC 20 and the distant LED chips 40 needs to cross the nearby LED chips 40, which can be implemented.

It should be noted that, in FIG. 14, a driver IC 20 drives five groups of the LED chips 40, each group including three LED chips 40, and the positions of the LEDs driven by the adjacent two driver ICs 20 interlace, the practical meaning of this driving manner lies in that, since the common driver IC 20 has 16 output channels to drive the LED chips 40, when the driver IC 20 drives five groups of the LED chips 40, 15 channels are needed; when the driver IC 20 drives 2λ3 groups of the LED chips 40, 18 channels are needed, thus 16 channels are not enough. Certainly, if 2×1 groups of the LED chips 40 are to be driven, the driver IC 20 with 18 channels may be manufactured.

In above embodiments, the LED chips 40 are all disposed on the pads 30. For example, as shown in FIG. 10, the R-LED chip 40 of the second LED chip 42 is mounted on a first pad corresponding to the first blind hole by bonding with silver glue; the G-LED chip and the B-LED chip are mounted on a first pad corresponding to the first blind hole by bonding with insulating glue, and anodes of the G-LED chip and the B-LED chip are connected to the first pad by bonding with gold wires, and then the first pad is electrically connected to an electrode layer.

Since the pad 30 and the LED chip 40 are not transparent, the mounting of the LED chip 40 on the pad 30 may improve the transparency, and the non-transparent pad 30 may further prevent the light of the LED chip 40 from propagating towards the rear side of the screen through the composite layer 10. In an application scenario of architecture, the affection of the light of the screen to the indoor space may be effectively eliminated. Meanwhile, the pad 30 as a mechanical component made of metallic may provide a good heat dissipation for the LED chip 40.

It should be noted that, the arrangement of the LED chip 40 on the pad 30 is not a specified implementation of the arrangement of a LED chip 40. For the blind holes in any arrangement of the LED chip 40, the design effect in this embodiment may be achieved by arranging the LED chip 40 on the corresponding pad 30.

Figure 16:
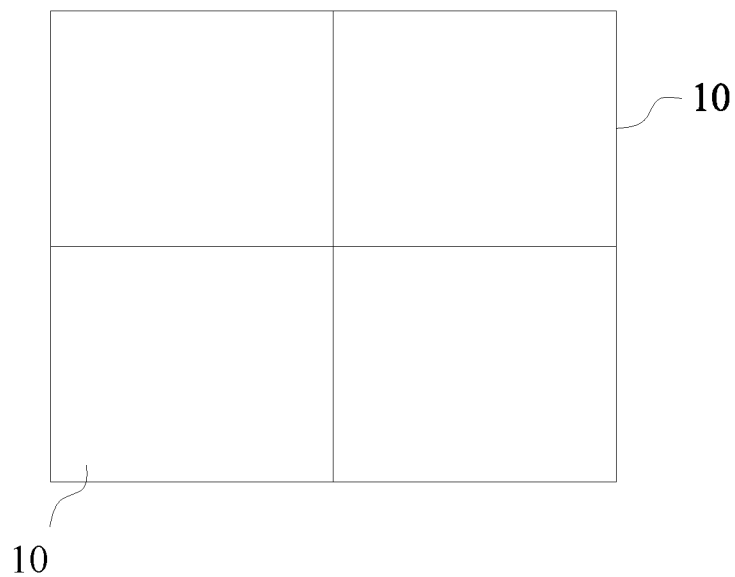
FIG. 16 is a structural diagram showing a LED panel according to the embodiments of the present disclosure.

The present embodiment further provides a LED panel, including at least two aforementioned LED components, and the arrangement of these LED components is shown in FIG. 16.

The LED components may be successively connected in a "zigzag" manner to form a unidirectional signal link.

Alternatively, each of LED components may also be connected to the signal bus to receive the signal.

Finally, a LED display screen is further provided. The LED display screen includes the LED panel as shown in FIG. 16.

Above is the description for the technical principle of the present disclosure in combination with optional embodiments.

And these descriptions are aimed at explaining the principle of the present disclosure, and these descriptions may not be explained to limit the scope of the protection of the present disclosure. Based on the explanations herein, other embodiments of the present disclosure may be achieved by those skilled in the prior art without creative works, and these embodiments are fell into the scope of the protection of the present disclosure.

What is claimed is:

1. An LED component, comprising: a composite layer, a plurality of driver ICs and a plurality of LED chips which are evenly arranged in length and breadth at the front side of the composite layer, wherein the driver ICs each is an unpackaged die;
   wherein the LED chips comprise a plurality of first LED chips, each of the driver ICs corresponds to a group of the first LED chips, the driver ICs are arranged at the front side of the composite layer, and the first LED chips are stacked and mounted on surfaces of the driver ICs; a plurality of wires going from cathodes of the respective LED chips are connected to the driver ICs; each of the driver ICs is connected with each other via a signal line,
   wherein the LED chips comprise a plurality of second LED chips; the second LED chips are mounted at the front side of the composite layer; a plurality of blind holes are opened at the front side of the composite layer, anodes of the second LED chips are connected to a positive electrode in the composite layer; a wire going from a VDD pin of each driver IC is connected to the positive electrode in the composite layer through one of the blind holes; a wire going from a GND pin of the each driver IC is connected to a negative electrode in the composite layer through one of the blind holes,
   wherein the ratio of the number of the first LED chips to the number of the second LED chips is 1:x, where x∈{2, 3, 4, 5, 6, 9}, and
   wherein the composite layer further comprises a substrate, a first electrode layer, a first insulation layer, a second electrode layer and a second insulation layer, which are successively arranged; one of the first electrode layer and the second electrode layer is configured as the positive electrode and the other one is configured as the negative electrode; the blind holes comprise a first blind hole penetrating the substrate and reaching the positive electrode, and a second blind hole penetrating the substrate and reaching the negative electrode; the wire going from the anode of the each LED chip is connected to the positive electrode through the first blind hole; the wire going from the VDD pin of the each driver IC is connected to the positive electrode through the first blind hole; the wire going from the GND pin of the each driver IC is connected the negative electrode through the second blind hole.

2. The LED component according to claim 1, wherein the composite layer is a transparent composite layer, and the wires and the signal line are gold wires arranged by bonding.

3. The LED component according to claim 1, wherein the composite layer further comprises a substrate, an electrode layer and a second insulation layer which are successively arranged;
   the electrode layer is provided with a positive electrode and a negative electrode, a plurality of blind holes are opened in the substrate, the blind holes go through the substrate and reach the positive electrode and the negative electrode.

4. The LED component according to claim 1, wherein the composite layer further comprises a third insulation layer and a signal line layer, the signal line layer is insulated from the first electrode layer or the second electrode layer; the blind holes further comprise a third blind hole penetrating the substrate and reaching the signal line layer; the signal line is a signal pattern layer disposed in the signal line layer, and a wire going from a signal pin of the each driver IC is connected to the signal pattern layer through the third blind hole.

5. The LED component according to claim 4, wherein the composite layer comprises at least two signal line layers and at least two third insulation layers.

6. The LED component according to claim 1, wherein a plurality of pads are arranged at the bottom of the blind holes, and the wires are electrically connected to the composite layer through the pads.

7. The LED component according to claim 1, wherein the LED chips and the driver ICs are mounted on the substrate by using chip-on-board (COB) process or chip-on-glass (COG) process, and the front side of the substrate is covered with transparent sealing glue.

8. An LED panel, comprising at least two LED components,
   wherein each of the LED components comprises: a composite layer, a plurality of driver ICs and a plurality of LED chips which are evenly arranged in length and breadth at the front side of the composite layer;
   wherein the LED chips comprise a plurality of first LED chips, each of the driver ICs corresponds to a group of the first LED chips, the driver ICs are arranged at the front side of the composite layer, and the first LED chips are stacked and mounted on surfaces of the driver ICs; a plurality of wires going from cathodes of the respective LED chips are connected to the driver ICs; each of the driver ICs is connected with each other via a signal line,
   wherein the LED chips comprise a plurality of second LED chips; the second LED chips are mounted at the front side of the composite layer; a plurality of blind holes are opened at the front side of the composite layer, anodes of the second LED chips are connected to a positive electrode in the composite layer; a wire going from a VDD pin of each driver IC is connected to the positive electrode in the composite layer through one of the blind holes; a wire going from a GND pin of the each driver IC is connected to a negative electrode in the composite layer through one of the blind holes,
   wherein the ratio of the number of the first LED chips to the number of the second LED chips is 1:x, where x∈{2, 3, 4, 5, 6, 9}, and
   wherein the composite layer further comprises a substrate, a first electrode layer, a first insulation layer, a second electrode layer and a second insulation layer, which are successively arranged; one of the first electrode layer and the second electrode layer is configured as the positive electrode and the other one is configured as the negative electrode; the blind holes comprise a first blind hole penetrating the substrate and reaching the positive electrode, and a second blind hole penetrating the substrate and reaching the negative electrode; the wire going from the anode of the each LED chip is connected to the positive electrode through the first blind hole; the wire going from the VDD pin of the each driver IC is connected to the positive electrode through the first blind hole; the wire going from the GND pin of the each driver IC is connected the negative electrode through the second blind hole.

9. An LED display screen, comprising an LED panel,
wherein the LED panel comprises at least two LED components, each of the LED components comprises: a composite layer, a plurality of driver ICs and a plurality of LEI) chips which are evenly arranged in length and breadth at the front side of the composite layer;
wherein the LED chips comprise a plurality of first LED chips, each of the driver ICs corresponds to a group of the first LED chips, the driver ICs are arranged at the front side of the composite layer, and the first LED chips are stacked and mounted on surfaces of the driver ICs; a plurality of wires going from cathodes of the respective LED chips are connected to the driver ICs; each of the driver ICs is connected with each other via a signal line,
wherein the LED chips comprise a plurality of second LED chips; the second LED chips are mounted at the front side of the composite layer; a plurality of blind holes are opened at the front side of the composite layer, anodes of the second LED chips are connected to a positive electrode in the composite layer; a wire going from a VDD pin of each driver IC is connected to the positive electrode in the composite layer through one of the blind holes; a wire going from a GND pin of the each driver IC is connected to a negative electrode in the composite layer through one of the blind holes,
wherein the ratio of the number of the first LED chips to the number of the second LED chips is 1:x, where x∈{2, 3, 4, 5, 6, 9}, and
wherein the composite layer further comprises a substrate, a first electrode layer, a first insulation layer, a second electrode layer and a second insulation layer, which are successively arranged; one of the first electrode layer and the second electrode layer is configured as the positive electrode and the other one is configured as the negative electrode; the blind holes comprise a first blind hole penetrating the substrate and reaching the positive electrode, and a second blind hole penetrating the substrate and reaching the negative electrode; the wire going from the anode of the each LED chip is connected to the positive electrode through the first blind hole; the wire going from the VDD pin of the each driver IC is connected to the positive electrode through the first blind hole; the wire going from the GND pin of the each driver IC is connected the negative electrode through the second blind hole.

10. The LED component according to claim 9, wherein the composite layer is a transparent composite layer, and the wires and the signal line are gold wires arranged by bonding.

* * * * *